(12) United States Patent
Valentian

(10) Patent No.: US 7,538,599 B2
(45) Date of Patent: May 26, 2009

(54) INTEGRATED CIRCUIT WITH STANDBY MODE MINIMIZING CURRENT CONSUMPTION

(75) Inventor: Alexandre Valentian, Saint Egreve (FR)

(73) Assignee: Commissariat a l'Energie Atomique (FR)

( * ) Notice: Subject to any disclaimer, the term of this patent is extended or adjusted under 35 U.S.C. 154(b) by 26 days.

(21) Appl. No.: 11/939,946

(22) Filed: Nov. 14, 2007

(65) Prior Publication Data

US 2008/0136505 A1    Jun. 12, 2008

(30) Foreign Application Priority Data

Nov. 14, 2006    (FR)    .................................. 06 09937

(51) Int. Cl.
*G05F 1/10* (2006.01)
(52) U.S. Cl. ..................................................... 327/534
(58) Field of Classification Search ................ 327/534, 327/535, 537, 538, 543
See application file for complete search history.

(56) References Cited

U.S. PATENT DOCUMENTS

| | | | |
|---|---|---|---|
| 4,716,307 A * | 12/1987 | Aoyama ..................... 327/543 |
| 6,087,893 A * | 7/2000 | Oowaki et al. .............. 327/537 |
| 6,940,307 B1 | 9/2005 | Liu et al. |
| 6,982,591 B2 * | 1/2006 | Abadeer et al. ............. 327/543 |
| 7,042,274 B2 * | 5/2006 | Hazucha et al. ............. 327/534 |
| 2002/0149036 A1 | 10/2002 | Yabe |
| 2006/0006929 A1 | 1/2006 | Caplan et al. |
| 2006/0091936 A1 | 5/2006 | Ikenaga et al. |

* cited by examiner

*Primary Examiner*—Jeffrey S Zweizig
(74) *Attorney, Agent, or Firm*—Lowe Hauptman Ham & Berner, LLP

(57) ABSTRACT

The invention relates to electronic integrated circuits capable of operating either in active mode or in standby mode and to have, in standby mode, a very low current consumption. According to the invention, the leakage current of a power transistor inserted in series between a supply terminal and an active circuit is controlled by a gate reverse overbias in the following manner: a first reference transistor, and a second reference transistor identical to the first, are biased with the same gate reverse overbias voltage as the power transistor, the first transistor having its source linked to the supply terminal, and the second reference transistor having its source linked to its drain. The leakage currents in these two transistors are compared, and it is considered that the optimal bias of the gate is obtained when the leakage currents are equal. Applications to circuits supplied by a battery or a cell (portable telephones, cameras, portable computers, etc.).

10 Claims, 3 Drawing Sheets

INTEGRATED CIRCUIT WITH STANDBY MODE MINIMIZING CURRENT CONSUMPTION

RELATED APPLICATIONS

The present application is based on, and claims priority from, France Application Number 06 09937, filed Nov. 14, 2006, the disclosure of which is hereby incorporated by reference herein in its entirety.

FIELD OF THE INVENTION

The invention relates to electronic integrated circuits capable of operating either in active mode or in standby mode and of having, in standby mode, a very low current consumption.

BACKGROUND OF THE INVENTION

These circuits are necessary notably in applications where the power supply is provided by a battery or a cell (portable telephones, cameras, portable computers, etc.), so as not to needlessly consume the energy of the power supply source.

In these applications, the circuits are generally made by CMOS technology (complementary metal oxide semiconductor), allowing lower consumption than other technologies.

To switch from an active mode to a standby mode, a power transistor TP interposed in series between one of the supply terminals A or M of the integrated circuit and the active part of the circuit (CA) is generally envisaged in the integrated circuit, as seen in FIG. 1; this transistor is controlled by a mode management circuit CGM which establishes one voltage or another on the gate of the transistor depending on whether the integrated circuit is in the active mode or on standby; the function of this power transistor is twofold:

in active mode: it is rendered highly conducting and allows through the whole of the current necessary for the active circuit, with a minimum voltage drop, therefore without needless power consumption;

in standby mode: it is off so as to interrupt the current from the power supply source to the remainder of the integrated circuit.

The power transistor must therefore meet several constraints: sufficiently high current in the on state; very low voltage drop in the on state; very low leakage currents in the off state; and finally, if possible, dimensions that are as reduced as possible so as to reduce the space required on the silicon of the integrated circuit.

Various types of power transistors attempting to meet this set of constraints have already been proposed in the prior art. Examples thereof will be found notably in the following published documents:

S. Mutoh et al., "1-V Power Supply High Speed Digital Circuit Technology with Multithreshold-voltage CMOS", IEEE Journal of Solid State Circuits, vol. 30, pp 847-854, August. 1995.

T. Inukai et al., "Boosted Gate OS (BGMOS): Device/Circuit Cooperation Scheme to Achieve Leakage-Free Giga-Scale Integration", Custom Integrated Circuits Conference, pp. 409-412, May 2000.

H. Kawaguchi et al., "A super Cut-Off CMOS (SCCMOS) Scheme for 0.5 V Supply Voltage with Picoampere Stand-by Current", IEEE Journal of Solid State Circuits, vol. 35 No. 10, pp 1498-1501, October 2000.

In the latter document, use is made of a power transistor with low threshold voltage providing a high current in the on state and whose leakage current is reduced by reverse overbiasing the gate in standby mode; by reverse overbias is understood a bias at a voltage lower than the most negative terminal of the supply voltage, for an NMOS transistor, or higher than the most positive supply voltage for a PMOS transistor.

The power transistor of the document cited last is that which exhibits the best compromise between area occupied (for a given current in the on state), and leakage current in the off state.

It is noted that the leakage current, which is firstly due to the conduction current $I_{STH}$ between source and drain (sub threshold current) decreases exponentially when the gate is biased more negatively (for an NMOS); it can become extremely low. However, a second phenomenon must be taken into account; this involves the appearance of a drain current induced by the gate: by reverse biasing the gate, a leakage current no longer appears between drain and source but between drain and substrate of the integrated circuit. Typically, in the configuration of FIG. 1 where the power transistor TP is a PMOS transistor whose source is linked to the most positive supply terminal A, the gate is brought to a still more positive potential in standby mode, while the drain will remain practically at the potential of the terminal M which is the low potential of the power supply. The electron-hole pairs generated naturally in the drain experience the influence of the sizeable electric field which then exists between gate and drain just where the gate overhangs the edge of the drain; the electric field generated between gate and drain tends to locally lower the potential barrier between drain and substrate; electrons can cross this barrier and pass towards the substrate, creating a substrate/drain leakage current despite the interruption of the source/drain current. This current $I_{GIDL}$ or drain current induced by the gate increases significantly when the voltage between gate and drain increases; the increase is substantially exponential.

The gate reverse overbias therefore gives rise to an additional leakage current for the power supply battery of the circuit, and this current grows strongly with the overbias level. This implies that if the gate-source voltage is increased too much negatively (NMOS) or positively (PMOS), the very strong reduction in the leakage current between source and drain no longer serves any purpose since another source of leakages becomes predominant.

The curve of FIG. 2 represents an exemplary plot of the two curves of leakage current varying in opposite directions. The scale is logarithmic for the currents along the ordinate and linear for the gate-source voltages along the abscissa. As long dashes the conduction current between drain and source $I_{STH}$; as short dashes: the drain current induced by the gate $I_{GIDL}$ (short dashes); as a solid line, the sum of these two currents which is the total leakage current $I_{OFF}$. The curve is plotted for an NMOS transistor, the gate-source voltage having negative values (gate more negative than the source); for a PMOS transistor, the curve would be identical but graduated as positive voltage (gate more positive than the source).

It is seen that the total leakage current exhibits a minimum for a certain gate-source voltage value, and it would be optimal to be at this value in standby mode.

Unfortunately, this optimal point is not easy to find in reality because of the spread in the technological parameters, within a fabrication or between several fabricated batches. It depends also on the value of the supply voltage of the circuit and the temperature. FIG. 3 illustrates an exemplary variation as a function of temperature; the curves of leakage current $I_{OFF}$ plotted in this figure, for respective temperatures of −40° C., −25° C., 0° C., +25° C., +50° C., +100° C., +125° C., show that the current can vary by more than a decade and a half between −40° C. and +125° C. when one is at the minimum of the curve at +25° C., and still more if one is to the right of the minimum.

In the prior art, it has been proposed to compare the leakage currents of two transistors similar to the power transistor but smaller and biased at two different gate voltages but such that their leakage currents are equal, and to then bias the power transistor at an intermediate value between the two different voltages, this value representing nearly the optimum.

This is described in patent publication WO 2006/017082 A2.

This document also describes another procedure using a single transistor similar to the power transistor; the leakage current is measured by the discharge time of a capacitor precharged to the supply voltage; one seeks the bias which maximizes the discharge time. But the discharge time might vary over a very wide span of values, and, moreover, the control transistor will not be under the same supply voltage conditions in the course of the discharge as the power transistor, thereby corrupting the principle of the measurement.

There also exists a third procedure, described in the article by C. Neau et al., "Optimal Body Bias Selection for Leakage Improvement and Process Compensation Over Different Technology Generations", ISLPED, 2003. This procedure is applicable to certain types of transistors only; it consists in reverse biasing the semiconductor substrate on which the power transistor is formed. But this procedure makes it necessary to find a compromise between two opposite currents whose variation is opposite as a function of bias, which are respectively the band-to-band tunnel current ($I_{BTBT}$) and the subthreshold conduction current $I_{SHT}$.

SUMMARY OF THE INVENTION

An objective of the invention is to effect an automatic bias which minimizes the leakage current in a manner that is as independent as possible of technological variations and spread, of variations in temperature, and of variations in supply voltage.

For this purpose, by examining the curves of FIG. 1, it is considered that one is practically at the optimal negative gate voltage (NMOS) if the subthreshold conduction current $I_{STH}$ (drain-source current) is equal to the drain current induced by the gate $I_{GIDL}$. This is not quite exact since the slopes of current variation versus gate source voltage are not the same but it is a very good approximation.

One contrives therefore to compare a current of type $I_{STH}$ and a current of type $I_{GIDL}$, with a view to finding the point where they are equal. But as it is not easy to produce a current $I_{STH}$ alone not comprising a component $I_{GIDL}$, we shall rathermore compare a current $I_{STH}+I_{GIDL}$ with a current $2.I_{GDIL}$, which amounts to the same when there is equality.

Two distinct currents are therefore produced in the integrated circuit, with a view to comparing them, one of type $I_{STH}+I_{GDIL}$ in a first transistor of the same technological construction as the power transistor (so as to have the same leakage current variation versus gate-source voltage), and the other of type $2.I_{GIDL}$ in a second transistor, identical to the first, mounted with its source and its drain joined in such a manner that the current $I_{STH}$ vanishes and the current $I_{GIDL}$ is doubled.

This is why there is proposed according to the invention a method of controlling the leakage current of a power transistor inserted in series between a supply terminal and an active circuit, in which the power transistor is strongly turned off in standby mode by a gate reverse overbias, characterized in that it comprises the following operations:

biasing a first reference transistor, and a second reference transistor identical to the first and of technological characteristics representative of the power transistor, with the same gate reverse overbias voltage as the power transistor, the first transistor having its source linked to the supply terminal, and the second reference transistor having its source linked to its drain, comparing the currents flowing through the two reference transistors in a current comparator, modifying the gate reverse overbias voltage in a direction that tends to reduce the difference between the compared currents.

The invention also proposes an integrated circuit comprising a power transistor in series between a supply terminal and an active circuit capable of operating in active mode or in standby mode, and a gate bias circuit for applying to the gate of the power transistor a forward bias potential in active mode, to turn on the transistor, and a reverse overbias potential in standby mode, to strongly turn off the transistor, characterized in that the bias circuit comprises a first reference transistor and a second reference transistor, identical to one another and of technological characteristics representative of the power transistor, receiving on their gate in standby mode the same reverse bias voltage as the power transistor, the first reference transistor having its source linked to the same potential as the source of the power transistor, and the second reference transistor having its source and its drain joined, a circuit for comparing the leakage currents of the two transistors, this comparison circuit having an input linked to the drain of the first reference transistor and an input linked to the drain of the second reference transistor, and a circuit for adjusting the reverse overbias voltage, receiving the output of the comparison circuit and reacting to this output so as to increase or decrease the reverse overbias voltage according to the sense of the result of the comparison performed by the comparison circuit so as to reduce the difference between the leakage currents of the first and second transistors.

The circuit for comparing currents preferably emits a brief pulse on a first output if the current on a first input is higher than on the second, and a brief pulse on a second output if the current on the second input is higher than on the first.

The circuit for adjusting the gate reverse overbias voltage preferably comprises two inputs linked to the outputs of the current comparator, and a set of two transistors mounted in series in analog push-pull arrangement, the gates of these transistors being controlled the one on the basis of one of the inputs the other on the basis of the other input, the output of the adjustment circuit being constituted by the joined drains of the two transistors.

It will be understood that the first input of the comparison circuit receives a drain current from the first reference transistor, which is a global leakage current of type $I_{STH}+I_{GIDL}$, while the second input receives a leakage current which does not comprise any component $I_{STH}$ because the source and the drain of the second reference transistor are short-circuited, and which comprises a component of drain current induced by the gate which is double the component $I_{GIDL}$ of the first transistor because the source contributes as much as the drain to this current and because the transistor is of the same size as the first.

BRIEF DESCRIPTION OF THE DRAWINGS

Other characteristics and advantages of the invention will appear on reading the detailed description which follows and which is given with reference to the appended drawings in which.

DETAILED DESCRIPTION OF THE DRAWINGS

Figure 1:
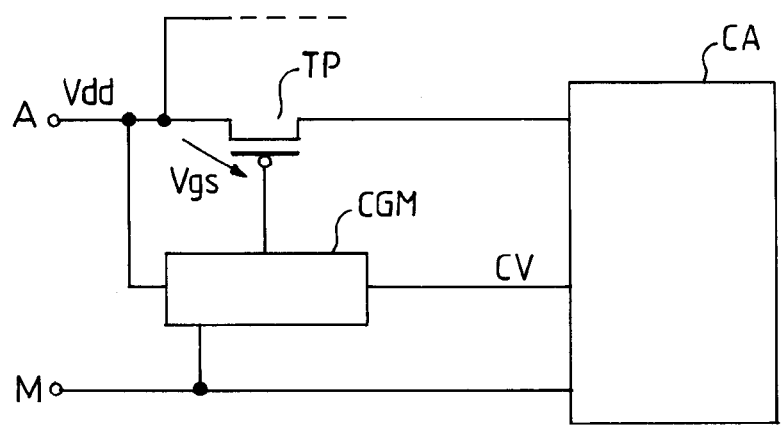
FIG. 1 represents the configuration of a circuit having an active mode and a standby mode, with a power transistor in series to control the switch from one mode to the other.

The main active part CA of the integrated circuit of FIG. 1 possesses an arbitrary functionality (for example telephony for a telephone, photography for a camera, etc.). This functionality is provided with an active mode and a standby mode. The standby mode can typically activate by itself after a determined time of non use, or else it can activate when commanded by a user.

There are two supply terminals A and M which directly supply the circuits which have to remain permanently supplied and which indirectly supply the active circuit CA, across a power transistor TP in series between one of the supply terminals and the circuit CA.

In the standby mode, the power supply of the active circuit CA is cut off by the transistor. Only a few circuits with low consumption remain supplied, for example a circuit (not represented) for detecting a request to return to the active mode and a mode management circuit CGM which controls the gate of the power transistor.

In what follows it is considered that the supply terminal A is a positive supply terminal at a voltage Vdd, the terminal M is a supply terminal that will be considered to be a ground terminal (zero potential), therefore more negative than the terminal A; the power transistor TP is a PMOS transistor and its source is linked to the terminal A. It must be understood however that the transistor TP could be an NMOS transistor inserted on the other power supply conductor, that is to say between the terminal M and the active circuit, the source of the transistor being linked to the terminal M.

The drain of the transistor TP is linked to the active circuit CA and the latter receives a supply current only if the transistor TP is conducting.

The mode management circuit CGM therefore has two possible operating states: in a first state corresponding to the active mode, it establishes a zero voltage (voltage of the terminal M) on the gate of the transistor TP, to render the transistor highly conducting with a very low voltage drop; in a second state corresponding to the standby mode, it establishes a turn-off voltage on the gate of the transistor so that the transistor no longer allows current through. The mode management circuit CGM is therefore essentially a circuit for biasing the gate of the transistor TP.

If the power transistor TP has a fairly high threshold voltage (in absolute value), it suffices that the voltage applied to the gate in standby mode be equal to the voltage on the terminal A to strongly block the passage of the current, and in this case the mode management circuit CGM can be extremely simple to make since it suffices to bring the gate either to the potential of the ground M or to the potential of the terminal A. But the drawback is that a power transistor made by a technology which gives it a high threshold voltage must be of fairly large size, failing which the forward voltage drop (for a given supply current) would be too high; this fairly large size is prejudicial in terms of fabrication costs.

If the power transistor TP has a lower threshold voltage (obtained through an appropriate choice of doping of the channel), permitting a lower transistor size, then the blocking might not be perfect if one merely applies the same potential to the gate as to the source.

Figure 2:
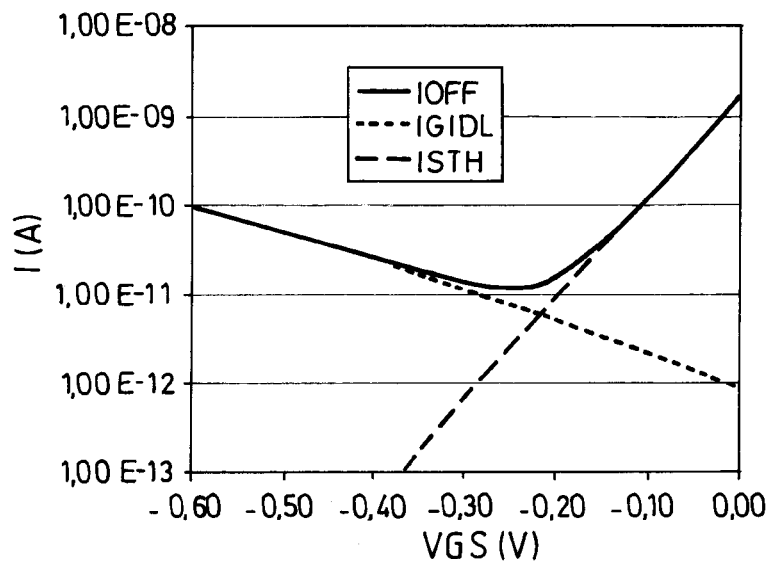
FIG. 2, already described, represents a curve of variation of leakage currents as a function of gate voltage, in reverse bias.
Figure 3:
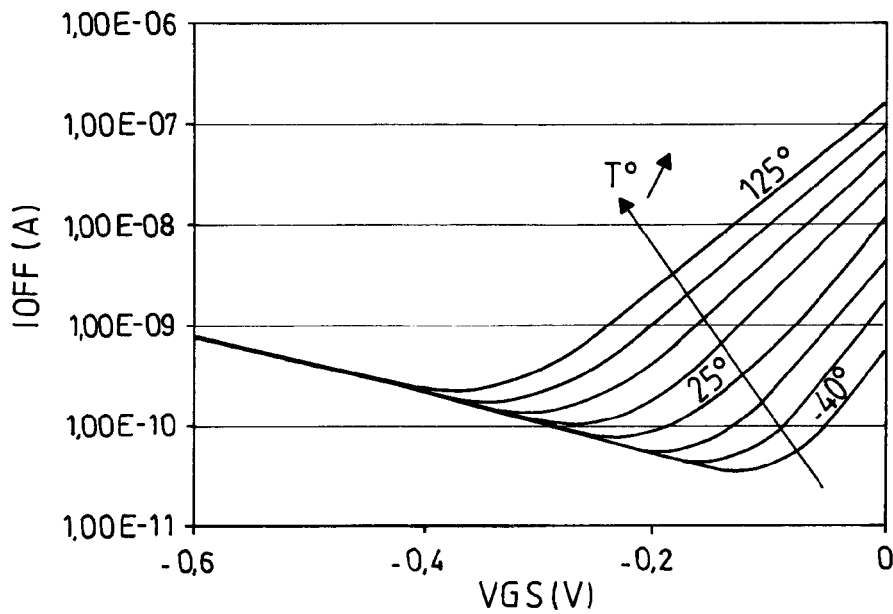
FIG. 3, already described, represents the variation of the global leakage currents as a function of temperature.

This is why, in this case, the circuit CGM is designed to apply to the gate a reverse overbias voltage that is still more positive than the voltage Vdd which is present on the terminal A; the subthreshold conduction current ($I_{STH}$) then reduces in accordance with FIG. 2 when the gate-source voltage increases in absolute value (sign of the values of Vgs of FIG. 2 to be reversed since here one is speaking of a PMOS transistor while the curve of FIG. 2 corresponds to an NMOS transistor).

Figure 4:
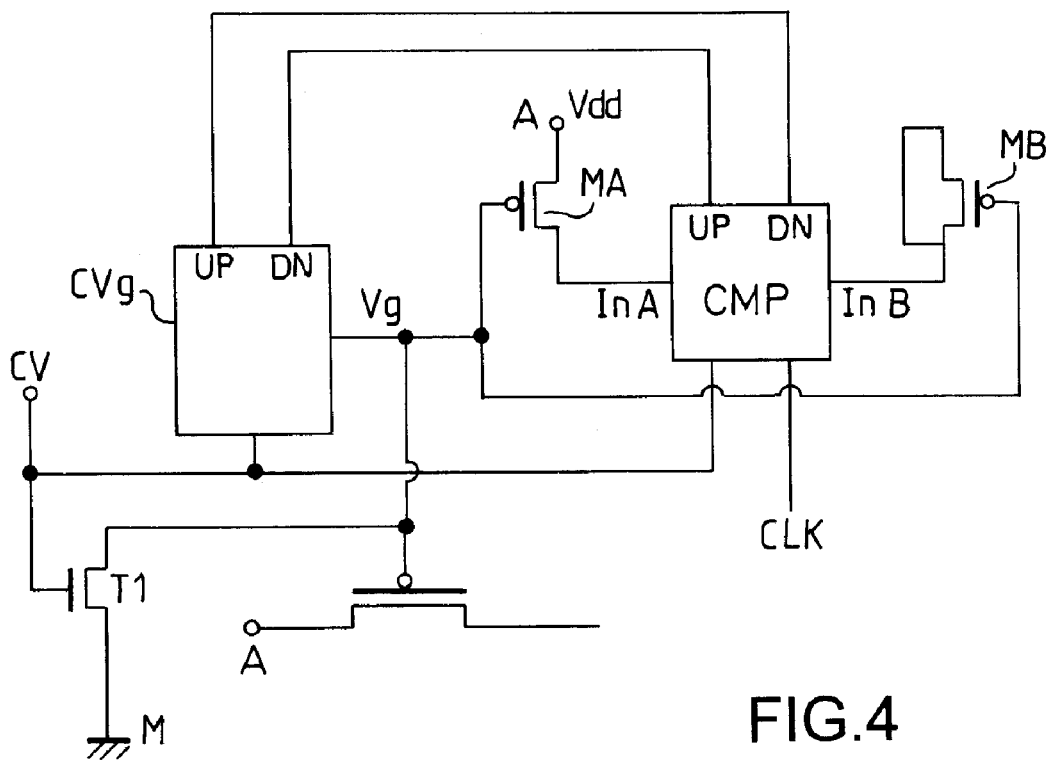
FIG. 4 represents a circuit according to the present invention.

The general structure of the mode management circuit according to the invention is represented in FIG. 4. The circuit has an input CV for receiving a mode control logic signal. If the mode is active, the control CV is at the high logic level (1); it turns on a transistor T1 which grounds the gate of the transistor TP, turning on the latter (PMOS). If the mode is the standby mode, the control CV is at the low logic level (0), turning off the transistor T1 and activating a gate reverse overbias circuit which applies to the gate of TP a potential Vg greater than the potential Vdd of the terminal A, at one and the same time fairly high so as to properly block the source-drain current $I_{STH}$ in this transistor but low enough not to generate a current $I_{GIDL}$ induced by the overly high gate.

This overbias circuit comprises mainly:

a first reference transistor, MA, having technological characteristics representative of those of the power transistor but of smaller size so as to limit the current consumption; by representative technological characteristics, is essentially understood the fact that it is made with the same technological steps and parameters, in particular the same threshold voltage (therefore the same channel doping level);

a second reference transistor, MB, identical to the transistor MA;

a circuit CVg for adjusting the gate voltage, which formulates a gate potential Vg which is applied to the gates of the three transistors TP, MA, MB; this circuit possesses control inputs UP and DN intended to act on the value of Vg;

a circuit for comparing currents CMP, which has two inputs InA and InB linked respectively to the drain of the transistor MA and to the drain of the transistor MB, and which has outputs linked to the inputs UP and DN of the circuit CVg;

and a clock input CLK receiving a clock logic signal with relatively low frequency, for example 1 MHz.

The transistor MA has its source connected, like that of the transistor TP, to the high supply terminal A, therefore to the supply voltage Vdd.

If one contrives matters such that the potential on the input InA is close to zero, then the currents which flow through the transistor MA are proportional to the leakage currents of the power transistor TP, with a proportionality ratio which is that of the gate widths of these two transistors; specifically, the transistor MA and the transistor TP are of the same technological construction and have substantially the same voltages on their respective electrodes; the leakage current $I_{OFFA}$ in the transistor MA, applied to the input InA, comprises a component $I_{STHA}$ of source-drain leakage current and a component $I_{GIDLA}$ of drain current induced by the gate, these being proportional to the components $I_{STH}$ and $I_{GIDL}$ of the transistor TP.

The transistor MB has its source linked to its drain and to the input InB of the current comparator; the gate receives the same voltage Vg as the transistors TP and MA. If one arranges for the potential of the drain of MB to be close to zero, then the current flowing through this transistor and applied to the input InB is a current which comprises:

- a component $I_{GIDLB}$ of drain current induced by the gate, proportional to the component $I_{GIDL}$ of the transistor TP; but also an identical component $I_{GIDLB}$ of source current induced by the gate, since the effect of the gate on the source is the same as the effect on the drain, the source being similar to the drain, with one and the same overlap of the gate above the source and the drain; in total a component $2I_{GIDL}$;
- but no source-drain current component $I_{STHB}$, quite simply because the source and the drain are at the same potential and there cannot be any current flowing between them.

It follows from this that the current comparator CMP will compare two currents which are respectively $I_{STHA}+I_{GIDLA}$ and $2.I_{GIDLB}$.

As the transistors MA and MB are identical, this amounts to comparing $I_{STHA}+I_{GIDLA}$ and $2.I_{GIDLA}$, or else $I_{STHA}$ and $I_{GIDLA}$, or else $I_{STH}$ and $I_{GIDL}$. By performing a regulation tending to adjust Vg to a value which maintains the equality between the currents on the inputs InA and InB, one tends therefore to maintain the bias of the transistor TP at a value where its two leakage currents $I_{STH}$ and $I_{GIDL}$ are equal, that is to say a value close to the optimum from the viewpoint of minimizing leakages in standby mode, as was explained in regard to FIG. 2.

The current comparator comprises two outputs UP and DN which provide complementary signals indicating which of the input currents at InA and InB is the higher; these signals serve to control the circuit CVg for adjusting the voltage Vg.

In the preferential exemplary embodiment, the signals UP and DN are brief complementary logic pulses, produced at the clock frequency CLK, and their effect is to slightly increase or to slightly decrease the voltage Vg at each clock pulse, so that the voltage Vg is stabilized at an average value where the currents $I_{STH}$ and $I_{GIDL}$ are equal. This optimal average value is then maintained whatever the value of the supply voltage or the temperature since the regulation is done permanently when the system is in standby mode.

Figure 5:
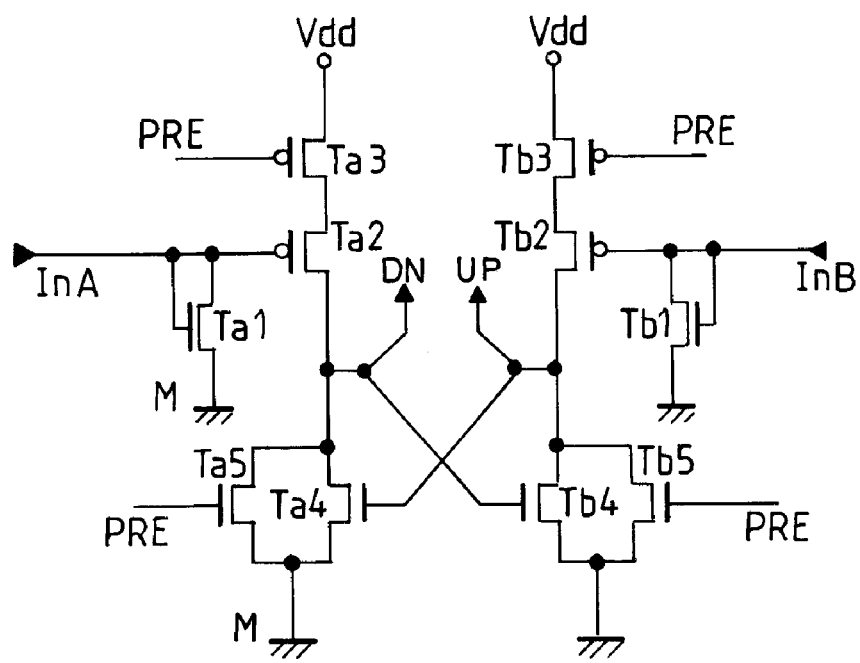
FIG. 5 represents a current comparator.

The current comparator used can be in accordance with that which is represented in FIG. 5. It is designed to perform instantaneous comparisons at a fairly low frequency (1 MHz for example) so as to minimize consumption, knowing that between two comparisons the voltage Vg will scarcely move. The comparison circuit delivers a brief pulse on the output UP when the current on the input InA is greater than the current on the input InB, and vice versa it delivers a brief pulse on the output DN in the converse case. The pulse on the output UP is used in the circuit of FIG. 7 to slightly raise the voltage Vg; the pulse on the output DN is used to slightly lower the voltage Vg. The voltage Vg is stabilized about an optimal average value.

The comparator of FIG. 5 operates in the following manner: the input InA which receives the drain current of the transistor MA is linked to the gate and to the drain of an NMOS transistor Ta1 mounted as a diode and having its source linked to the ground M; the transistor Ta1 serves as current-voltage converter; because the leakage current which will flow through this transistor is very low, the voltage on the input InA will vary proportionally to the current but will always remain very close to zero, this being desirable, it is recalled, so that the transistor MA is, as far as possible, under the same conditions as the transistor TP; the input InA is linked additionally to the gate voltage of a PMOS transistor Ta2.

In an identical manner, the input InB is linked to a current-voltage converter NMOS transistor Tb1, mounted as a diode between InB and the ground M; the input InB is also linked to the gate of a PMOS transistor Tb2.

The transistors Ta2 and Tb2 form part of a pair of differential branches each comprising three transistors in series Ta3, Ta2, and Ta4 (first branch) or Tb3, Tb2, Tb4 (second branch). The transistors Ta3 and Tb3 are PMOSs having their source at the supply voltage Vdd and their gate controlled by a precharge signal PRE. The precharge signal PRE, normally at the level 1, switches to zero periodically (period of the clock CLK) to trigger a comparison step.

The transistor Ta2 is a PMOS which has its source linked to the drain of Ta3 and its drain linked to the drain of the NMOS transistor Ta4. The source of the transistor Ta4 is grounded. The joined drains of Ta2 and Ta4 form the output DN of the current comparator. The arrangement is the same for the second branch, the transistors Tb3, Tb2, Tb4 being mounted like the transistors Ta3, Ta2, Ta4. The joined drains of the transistors Tb2 and Tb4 form the complementary output DN of the current comparator.

The gate of the transistor Ta4 is linked to the output UP and the gate of Tb4 is linked to the output DN, this crossover between the differential branches forming an unstable flip-flop tending to very rapidly toggle the output UP and the output DN into complementary stable logic states if a slight imbalance in currents appears in the differential branches.

Finally, an NMOS transistor Ta5 in parallel with the transistor Ta 4, and an NMOS transistor Tb5 in parallel with the transistor Tb4 are controlled by the precharge signal PRE to maintain the outputs UP and DN at zero outside of the comparison phase defined by the signal PRE.

When the signal PRE goes briefly to zero for a comparison phase, the off transistors Ta5 and Tb5 no longer take part; Ta3 and Tb3 become conducting; the zero potentials of UP and DN tend to rise; the currents in the differential branches depend on the level of the potential of the inputs InA and InB, that is to say the values of leakage current originating from the transistors MA and MB; if the current in the input InA is higher than the current in the input InB, the current in Ta2 is lower than the current in Tb2; the potential of the output DN tends to rise less quickly than the potential of the output UP; the faster rise of the potential UP augments the conduction of Ta4; the less fast rise of DN limits the conduction of the transistor Tb4, confirming the direction of the initial imbalance; the system toggles very rapidly to a high logic level of UP and a low logic level of DN; reverse toggling would occur if the current in the input InA were lower than the current in the input InB.

It will be noted that all the transistors of the branch Ta3, Ta2, Ta4 are then conducting if it is the output UP which has gone to the high level; this consumes current and it is therefore necessary for the pulse PRE to be very brief so as to again interrupt this consumption by the transistor Ta3 (or Tb3). It is moreover desirable to slave the duration of the pulse PRE to the toggling of the signal UP or DN to minimize this consumption.

At the end of the precharge pulse PRE the outputs UP and DN return to zero. The signals produced by the current comparator at the periodicity of the precharge pulse (period of CLK) are therefore a brief pulse on one of the two outputs UP and DN, the other remaining at zero.

Figure 6:
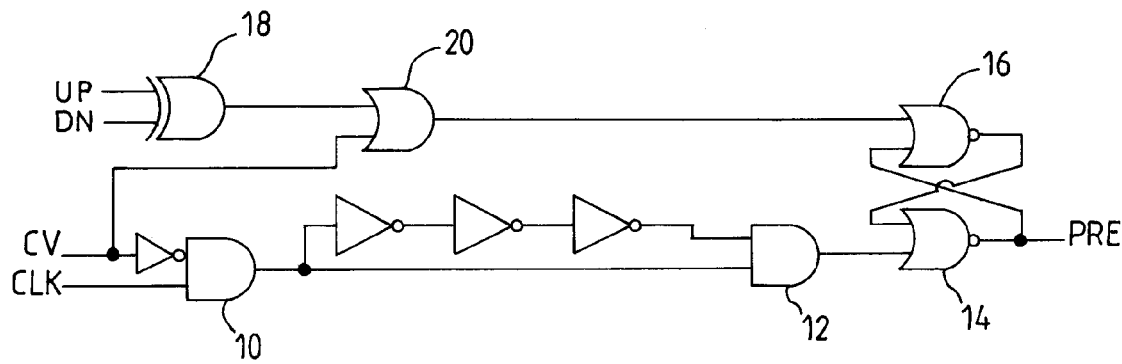
FIG. 6 represents a circuit providing a precharge signal.

FIG. 6 represents a circuit forming part of the current comparator, which circuit makes it possible to periodically formulate a very brief precharge pulse PRE; the circuit uses the output signals UP and DN of the comparator themselves to interrupt the precharge pulse.

This circuit receives the clock CLK and the mode control signal CV. For the active mode (CV=1) the signal PRE remains permanently at 1 and there is never any precharge pulse. UP and DN remain at zero and the circuit of FIG. 7 which formulates the voltage Vg leaves the latter floating, so that the value of the voltage Vg, dictated by the transistor T1 of FIG. 4, is zero.

For the standby mode (CV=0), the AND gate 10 transmits the clock CLK, and its complement delayed by reversers in series, to the inputs of an AND gate 12 so as to produce a very brief triggering pulse on the rising edge of the clock signal; this pulse, applied to a first input of a flip-flop RS consisting of two NOR gates 14 and 16 looped together, causes the output signal PRE of this flip-flop, initially at 1, to switch to zero. The comparison process is then triggered in the current comparator circuit of FIG. 6 and will cause the output UP or the output DN to switch to the high level.

An Exclusive-OR gate 18 receives the signals UP and DN and provides a signal, in general zero (since UP and DN are usually at 0), which switches to 1 on the appearance of the high level on the output UP or DN of the comparator.

As soon as UP or DN switches to 1, the other remaining at zero, the output of the Exclusive-OR gate 18 switches to 1; this output is linked to an input of an OR gate 20 which has CV=0 on its other input; the output of the OR gate 20 switches from zero to 1; this switch to 1 toggles the flip-flop 14, 16 back the other way, which resets the signal PRE to 1.

The precharge signal PRE remains at 1 up to the following rising edge of the clock, or remains at 1 if the circuit switches to active mode (CV=1, turning off the clock, maintaining the output of the gate 12 at zero and the output of the gate 20 at 1 therefore immobilizing the flip-flop RS).

Figure 7:
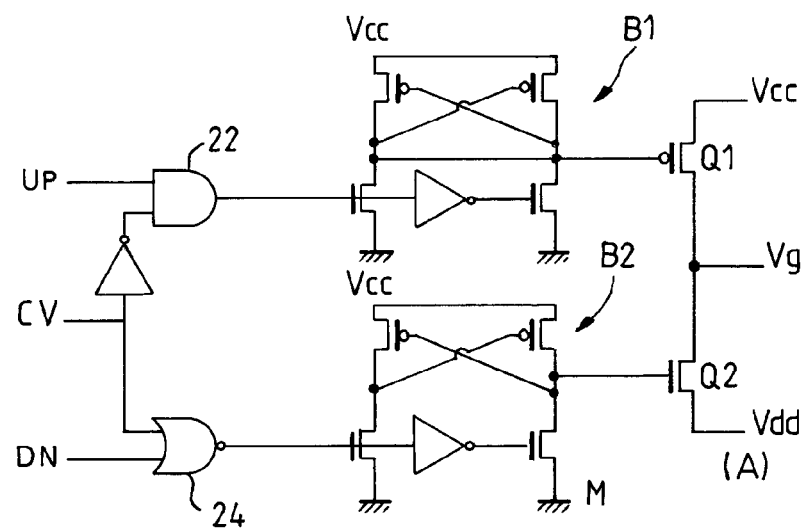
FIG. 7 represents a circuit for adjusting the voltage Vg.

FIG. 7 represents the circuit CVg which adjusts the voltage Vg in standby mode on the basis of the pulses appearing on the outputs UP and DN of the current comparator, which pulses are transmitted on corresponding inputs UP and DN of the circuit CVg.

The circuit CVg has an input CV which disables it when CV=1 that is to say in active mode. An AND gate 22 receives the complement of CV and the input UP. Its output provides a brief logic level 1 pulse in standby mode when the current comparison provides a brief level 1 pulse on the input UP. For the input DN, a NOR gate 24 receives CV and the input DN; the output of the gate 24, normally at 1, provides a brief logic level 0 pulse in standby mode when the current comparison provides a brief level 1 pulse on the input DN.

Two transistors Q1 (PMOS) and Q2 (NMOS) are mounted in series in analog push-pull arrangement between two dc voltages Vdd and Vcc (Vcc greater than Vdd, Q1 connected to Vcc, Q2 connected to Vdd). The junction point of the drains of these transistors provides the desired bias voltage Vg. The drains are at high impedance in general since the gate of Q1 is normally brought to the higher potential Vcc and the gate of Q2 is brought to the ground potential (lower than Vdd).

If a level 1 pulse appears at the output of the AND gate 22, a flip-flop B1 controlled by this output causes the potential on the gate of Q1 to switch to zero. Q1 becomes conducting for the time of this pulse and tends to cause the potential Vg to rise. There is no action on the transistor Q2 which remains off. At the end of the pulse, the potential Vg has risen somewhat.

Conversely, if a level 1 pulse appears at the output of the NOR gate 24, a flip-flop B2 controlled by this output causes the potential on the gate of Q2 to switch to Vcc (higher than Vdd, the deviation between Vcc and Vdd being greater than the threshold voltage of Q2). Q2 becomes conducting for the time of this pulse and tends to cause the potential Vg to fall. There is no action on the transistor Q1 which remains off. When the pulse is interrupted, the potential Vg has dropped somewhat.

This gate reverse overbias circuit must use not only the ground potential (connection to the terminal M) and the potential Vdd (connection to the terminal A) but also a higher potential Vcc than that of the terminal A. The higher potential Vcc can be obtained either directly if for one reason or another it is present in the integrated circuit, for example on an exterior connection terminal, or indirectly, for example by way of a charge pump. The production of a higher voltage than the general supply voltage by means of a charge pump is conventional. By way of example, the supply voltage Vdd is 1.2 volts, standard for small portable apparatuses, and the higher voltage Vcc can be 2.5 volts.

To conclude, it may be noted that if the power transistor TP is formed in a well diffused in the substrate of the integrated circuit, it is possible to act on the bias of the well so as to further reduce the leakage currents. Specifically, if the well is not at the potential of the source of the transistor (terminal A) but at a potential VBS greater than that of the source (for a PMOS transistor), then the leakage currents are reduced. It is possible to take typically as the potential of the well the higher potential Vcc than the potential Vdd of the terminal A. A value of Vcc twice as high as Vdd is particularly apt. In this case, it is found that the optimum of the gate voltage Vg decreases in absolute value, and this decrease is favorable for avoiding the aging of the gate oxide; this aging is in fact all the more significant the higher the gate voltage in absolute value (so-called "gate dielectric stress" phenomenon).

The invention claimed is:

1. A method for controlling the leakage current of a power transistor inserted in series between a supply terminal and an active circuit, in which the power transistor is turned off in standby mode by a gate reverse overbias, said method comprising the following steps:

biasing a first reference transistor and a second reference transistor identical to the first transistor with the gate reverse overbias applied to the power transistor, said first and second reference transistors having technological characteristics representative of the power transistor, the first reference transistor having its source linked to the supply terminal, and the second reference transistor having its source linked to its drain, comparing the currents flowing through the two reference transistors in a current comparator, and modifying the gate reverse overbias voltage in a direction that tends to reduce the difference between the compared currents.

2. An integrated circuit comprising a power transistor in series between a supply terminal and an active circuit capable of operating in active mode or in standby mode, and a gate bias circuit for applying to the gate of the power transistor a forward bias potential in active mode to turn on the power transistor and a reverse overbias potential Vg in standby mode to strongly turn off the power transistor, wherein said bias circuit comprises:

a first reference transistor and a second reference transistor identical to one another and of technological characteristics representative of the power transistor, said reference transistors having respective gates and receiving on their gate in standby mode the reverse bias voltage Vg applied to the power transistor, the first reference transistor having its source linked to a potential equal to a potential of a source of the power transistor, and the second reference transistor having a source and a drain joined together, a comparison circuit for comparing leakage currents of the first and second transistors, this comparison circuit having a first input linked to a drain of the first reference transistor and a second input linked to the drain of the second reference transistor, and an adjustment circuit for adjusting the reverse overbias voltage Vg, receiving an output of the comparison circuit and reacting to this output so as to increase or decrease the reverse overbias voltage Vg according to a sense of the result of the comparison performed by the comparison circuit so as to reduce a difference between the leakage currents of the first and second transistors.

3. The integrated circuit as claimed in claim 2, wherein the circuit for comparing currents comprises a comparator having a first and a second outputs and capable of producing a brief pulse on a first output if the current on a first input is higher than on the second, and a brief pulse on a second output if the current on the second input is higher than on the first.

4. The integrated circuit as claimed in claim 3, wherein the circuit for comparing currents comprises two differential branches retroacting on one another so as to produce fast toggling in the event of a difference in currents on the inputs, and a precharge circuit establishing a signal for triggering a comparison whose startup is controlled by a clock edge and whose stopping is controlled by the appearance of a brief pulse on one of the outputs of the comparator.

5. The integrated circuit as claimed in claim 2, wherein the inputs of the circuit for comparing currents are each linked to a current-voltage converter.

6. The integrated circuit as claimed in claim 5, wherein the voltage converter is a transistor mounted as diode between the input and another supply terminal.

7. The integrated circuit as claimed in claim 3, wherein the circuit for adjusting the gate reverse overbias voltage comprises two inputs linked to the outputs of the current comparator, and a set of two transistors mounted in series in analog push-pull arrangement and having respective gates controlled each by a respective one of the inputs, the output of the adjustment circuit being constituted by joined drains of the two transistors.

8. The integrated circuit as claimed in claim 3, wherein the inputs of the circuit for comparing currents are each linked to a current-voltage converter.

9. The integrated circuit as claimed in claim 4, wherein the inputs of the circuit for comparing currents are each linked to a current-voltage converter.

10. The integrated circuit as claimed in claim 4, wherein the circuit for adjusting the gate reverse overbias voltage comprises two inputs linked to the outputs of the current comparator, and a set of two transistors mounted in series in analog push-pull arrangement and having respective gates controlled each by a respective one of the inputs, the output of the adjustment circuit being constituted by joined drains of the two transistors.

* * * * *